United States Patent [19]
Borkowicz

[11] Patent Number: 4,760,439
[45] Date of Patent: Jul. 26, 1988

[54] BI-DIRECTIONAL OVERVOLTAGE PROTECTION DEVICE

[75] Inventor: Jerzy Borkowicz, Ottawa, Canada

[73] Assignee: Northern Telecom Limited, Montreal, Canada

[21] Appl. No.: 926,606

[22] Filed: Nov. 4, 1986

[51] Int. Cl.⁴ .................. H01L 29/747; H01L 29/74
[52] U.S. Cl. ........................................ 357/39; 357/38; 357/86
[58] Field of Search ............... 357/39, 38, 86

[56] References Cited

U.S. PATENT DOCUMENTS

| | | | |
|---|---|---|---|
| 3,360,696 | 12/1967 | Neilson et al. | 357/39 |
| 3,476,993 | 11/1969 | Aldrich et al. | 357/39 |
| 3,928,093 | 12/1975 | Van Tongerloo et al. | 357/39 |
| 4,511,913 | 4/1985 | Nagano | 357/38 |

FOREIGN PATENT DOCUMENTS 0098554  6/1984  Japan ..................... 357/39

Primary Examiner—Martin H. Edlow
Assistant Examiner—Robert P. Limanek
Attorney, Agent, or Firm—John E. Mowle

[57] ABSTRACT

A five layer two electrode semiconductor switching device which provides bi-directional overvoltage protection. The device is constructed so that relatively high holding currents are achieved without substantially altering its turn-on switching time, or its power handling capabilities. This is achieved by providing a shorting junction along both sides of the outer diffused regions of the device thereby substantially reducing its resistance when conducting.

5 Claims, 4 Drawing Sheets

BI-DIRECTIONAL OVERVOLTAGE PROTECTION DEVICE

This invention relates to switching devices used in overvoltage protection applications. The device finds particular application in protecting telephone circuits from lightning and like surges.

BACKGROUND OF THE INVENTION AND DESCRIPTION OF THE PRIOR ART

Bi-directional semiconductor switching devices are known in the art. Examples of two such prior art switching devices will be described with reference to the accompanying drawings in which:

FIG. 1 marked PRIOR ART is a sectional view of one known type of bi-directional protector device; and FIG. 2 marked PRIOR ART is a sectional view of another known type of bi-directional protector device.

In U.S. Pat. No. 3,476,993 at FIG. 8, Aldrich et al show a five-layer two electrode semiconductor NPNPN switch. This Figure is substantially replicated in FIG. 1. The n-type regions 40, 41 at the top and bottom are diffused into respective p-type layers 42, 43, the diffusions and laterally adjacent exposed parts of the p-layers having common electrodes 45, 46 in conductive contact therewith. At a threshold voltage and current, the device switches, the polarity of the applied voltage being immaterial since the device is symmetrical.

As explained in the patent, when a negative voltage is applied to one of the electrodes 45 relative to the other electrodes 46, the pn junction bounding the adjacent n-type diffusion (e.g. base-emitter junction $J_{E1}$) becomes forward biased and the junction between the central n-layer 44 and the intermediate p-layer 42 (e.g. base-collector junction $J_{C1}$) becomes reverse-biased. At low voltage, the base-emitter junction is practically inoperative as an emitter because the n-type diffusion and the exposed part of the p-layer are shorted at the junction of the electrode 45. A small saturation current flows across the reverse-biased base-collector junction. As the voltage approaches the avalanche voltage of the base-collector junction, current flow across that junction tends to move along the p-layer 42 around the n-diffusion 40 towards that part of the electrode 45 adjacent the exposed p-region. The current increases rapidly and there is a resulting voltage drop produced by this current flow in that part of the p-layer next to the n-diffusion 40. This voltage drop acts to forward bias the base-emitter junction with the largest bias occurring at the edge of the junction furthest from the shorted contact point (i.e. furthest from the junction of $J_{E1}$ and 45).

The effective emitter efficiency, and hence transistor gain, increases rapidly with increased current flow. When the current reaches a level $I_s$ referred to as the switching or turn-on current, at which the sum of the common base gains of the NPN (layers 40, 42, 44) and the central PNP (layers 42, 44, 43) transistor sections is greater than unity, the device switches on. As the voltage across the base-collector junction $J_{C1}$ drops, the current originally distributed over the entire area of the p-layer shifts mainly to a region under the base-emitter junction $J_{E1}$ and the device approaches its low impedance state. Thus a feedback action results in the switching transition being very abrupt.

The Aldrich device is rectangular in area with an overall length to width ratio of about 1:2. One n-diffusion is at the top of the device on one side, and the other n-diffusion is at the bottom of the device on a laterally and vertically opposed side. With this aspect ratio the n-type diffusions are essentially square (i.e. an aspect ratio of 1:1) in plan view, and do not effectively overlap. At high voltage, but before switching when current passes into the Aldrich device from the conductive electrode 46, at the exposed part of the p-region 43 on the lower side, it flows through the layers 44, 42 to the conductive electrode 45, and thus across and around the other n-type diffusion 40. After switching, the current flows straight upwardly from the conductive electrode 46 through the p-type input region 43 and the layers 44, 42 and the overlapping n-type diffusion 40 to the conductive electrode 45, with substantially uniform current density. The symmetrical action of the device is in fact achieved by two unidirectional devices sharing the same central n-type and intermediate p-type regions.

When an overvoltage condition of such device has terminated, it is required that the device switch itself off so that the circuit which the device protects can return to normal operation. Devices of the type shown in the Aldrich patent can be readily constructed to meet such requirements a fast turn-on times and low power dissipation, when the minimum holding current (i.e. the minimum current required to maintain conduction once the device has been triggered by an overvoltage) is small. Typical minimum holding currents would be in the order of 10 to 50 milliamps. This is not a problem in applications where all voltage across the device disappears once the overvoltage has been removed, such as in the Aldrich device which was initially developed as a switching device. However, in telephone applications, the protection device is generally connected to a telephone line having a central office battery supply voltage of typically up to 52 volts (nominally 48 volts) delivered through a 200 ohm resistor. As a result the minimum holding current for the device must be greater than 260 milliamps or else it will not return to its high impedance state once the overvoltage condition has disappeared.

It can be shown that the holding current $I_h$ is a function of $alpha_1$, $alpha_2$ and $1/R$, where R is a measure of the effective resistive path in the p-layer of the active NPN device (i.e. the base layer) and $alpha_1$ and $alpha_2$ are the respective gains of the NPN and PNP transistors which make up the NPNP switching part of the device at one polarity. By decreasing the resistance R or the gains $alpha_1$, $alpha_2$ the value of the holding current $I_h$ can be increased. However, there is a penalty in decreasing the transistor gains since a device with low gain, usually as a result of reduced carrier lifetime, is very slow. This causes slow switching, very high power dissipation, and low device power handling capability. Alternatively, the value of R can be decreased by increased doping of the p-type layers and/or increased thickness of the p-type layers. However this decreases the gain $alpha_1$ and hence is unsatisfactory.

An important aspect is the realization that the value of R increases in proportion to the width W of the n-type diffusion 40 since current crossing the collector junction $J_{C1}$ must take a longer path through the p-layer 42 before it can flow to the top electrode 45 where that electrode meets the exposed p-type region. R also increases in inverse proportion to the length L (i.e. the length of the device perpendicular to the paper) of that diffusion 40. Thus R is approximately proportional to W/L, hence the holding current $I_h$ is proportional to L/W or an equivalent effective factor in the case of other than rectangular n-type diffusion geometry. For maximum power handling in either polarity the current density and hence the surface areas of the operating portions 40, 43 (or 41, 42 if the overvoltage current is reversed) of the device in contact with the conductive electrodes 45 and 46 should be about the same. As a result simply decreasing the width W of the n-type diffusion areas 40 and 41 also decreases the power handling capabilities of the device. These conflicting requirements do not appear to be reconcilable, utilizing the structure shown by Aldrich.

In U.S. Pat. No. 3,928,093 at FIG. 15, van Tongerloo et al show a circulo-symmetric NPNPN device in which the n-type diffusions 18 overlap one another. In this Figure which is substantially replicated in FIG. 2, the device is switched much as described previously for the Aldrich et al device. However, in this case, immediately prior to switching, current tends to flow directly between the exposed parts of the upper and lower p-regions 14, 14 in the PNP part of the device comprising layers 14, 10, 14. Unlike the Aldrich device, only a portion of the current flows through the offset part of the NPNP switching part. Consequently, the gain of the PNP device before switching is higher than in the Aldrich device and therefore the device can turn-on faster.

For the annular n-diffusion 18 used in the van Tongerloo device, W is approximately the difference between the outer R1 and inner R2 radii of the annular diffusion 18, and L is approximately the median circumference of this diffusion. The value of R can be reduced by reducing (R1−R2) and/or increasing L.

For a device having a fixed diameter the object of reducing the resistance of R by reducing the ratio of W/L (i.e. increasing L/W) and the object of having an n-diffusion 18 under the conductive contact equal in area to the exposed p-region 14 under that contact, are hard to reconcile. As stated above, this is a necessity for optimum power handling. Thus in the van Tongerloo device, if the requirement for a high L/W ratio is satisfied, then (R1−R2) is so small that the area of layer 14 remaining in the centre of the device is substantially larger than the area of the annular n-type diffusion 18. Conversely, if the two areas are equal, the L/W ratio will be about 18:1, in which case the resistance R is practically too high.

Thus to increase the holding current $I_h$, the length to width ratio of the n-diffusion 18 can be altered to produce a very long narrow diffusion. However, the current carrying capacity of the resulting small area n-diffusion would be low, and the current output density would be extremely high in comparison to the input current density through the exposed p-diffusion 14 at the opposit face of the device. Consequently although the ratio of L/W is made higher than Aldrich it too cannot achieve a satisfactory minimum holding current while still meeting the other criteria.

It has been discovered that by modifying the topography of these bi-directional prior art devices and the surface area in contact with each conductive electrode in a particular way, it is possible to decrease the resistance R, while maintaining the total surface area of the electrodes in contact with each of the n-diffusions substantially equal to those of the p-regions. By making these modifications and concurrently maintaining the n-diffusions on opposite sides of the device in direct alignment with each other, the requirements for a protector having a high minimum holding current can be met without sacrificing the need for fast turn-on times and high current carrying capabilities during an overvoltage condition. As will be explained hereinafter, a key aspect of the modified topography is that the surface area be divided so that there is a significantly increased junction zone between the n-type diffusions, the p-type layers and the conductive electrodes. These modifications can be made to either a circulo-symmetric device as in van Tongerloo or a linear device as in Aldrich.

According to the present invention, there is provided a bi-directional overvoltage protection device comprising a central semiconductor layer of one semiconductor type, flanking semiconductor layers of an opposite semiconductor type, and at least two regions of said one semiconductor type in each of the flanking layers at each outer face thereof, each region being disposed directly opposite a region in the other flanking layer. Each of the outer faces having an electrode in conductive contact thereon which extends to cover the regions and exposed parts of the layers contiguous thereto. The device is characterized by a shorting junction formed at the intersection of the outer face of each layer, the electrode in conductive contact therewith and the contiguous region, the shorting junction extending along both sides of at least one of the regions. Consequently for a given width of that one region, its resistance when conducting is substantially one quarter that, were the electrode to contact the shorting junction along only one side. To have the same value of R in a device having a region shorted along only one side as in the prior art Figures, the width W would have to be decreased by a factor of four.

The device is also characterized by a topography in which the total area of the exposed parts of the layers is substantially equal to the total area of the regions at each surface so that when the device is conducting current in the on state, current input density at one surface is substantially equal to current output density at the opposed surface.

In one preferred device, the one semiconductor type is an n-type and the opposite semiconductor type is a p-type. In another, the device has a plurality of regions in each flanking layer, and the length to width of each of the regions is such that the resistance per unit length is substantially constant, whether or not the shorting junction at the intersection of the region, the layer and the contacting electrode is along one or both sides of the region.

A key aspect of this modified topography is the semiconductor regions in the flanking semiconductor layers of the device are disposed so that the conductive contact overlying the outer surfaces results in a shorting junction along both sides of the junction between the regions and the layers. For a given width of the region, this shorting junction along both sides quarters the effective resistance R over that which would be obtained were the junction shorted along only one side as taught in the prior art Aldrich and van Tongerloo patents. This occurs because the lateral distance between the shorting junction and the imaginary line of highest impedance midway between the two junctions is one half that of a region shorted on only one side thereby halving the impedance of each side. In addition, because both halves are in parallel, the resistance R is also halved so that the overall resistance is quartered. As a result it is now possible to provide a device having a sufficiently low resistance R that the minimum holding current requirements can be met, yet still meeting the requirement that the total areas be equal.

The protection device can be rectangular, having one or more parallel strip regions of length L and width W. Alternatively, the device can be circulo-symmetric having one or more concentric n-type regions formed in the p-type layer at each face. Each region having a radial width W and median circumference L. Preferably the effective aspect ratio L/W of all of the regions having a shorting junction along both sides is at least about 30:1.

The multilayer device chip may have mesa edges at which pn junctions between one of the n-diffusions and the adjacent p-layer intersects a surface of the mesa at an acute angle and said mesa surface has a passivating layer extending over it. A planar configuration may also be used. The device can alternatively be implemented as a PNPNP multilayer structure.

BRIEF DESCRIPTION OF THE DRAWINGS

Embodiments of the invention will now be described by way of example with reference to the accompanying drawings in which.

Figure 1:
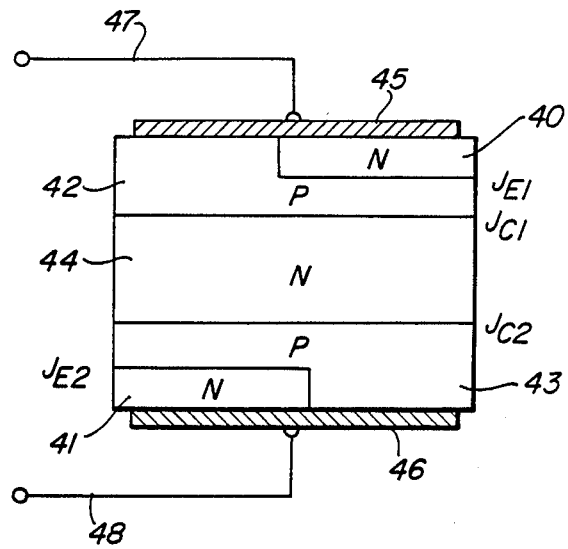
FIG. 1 marked PRIOR ART is a sectional view of one known type of bi-directional protector device.
Figure 2:
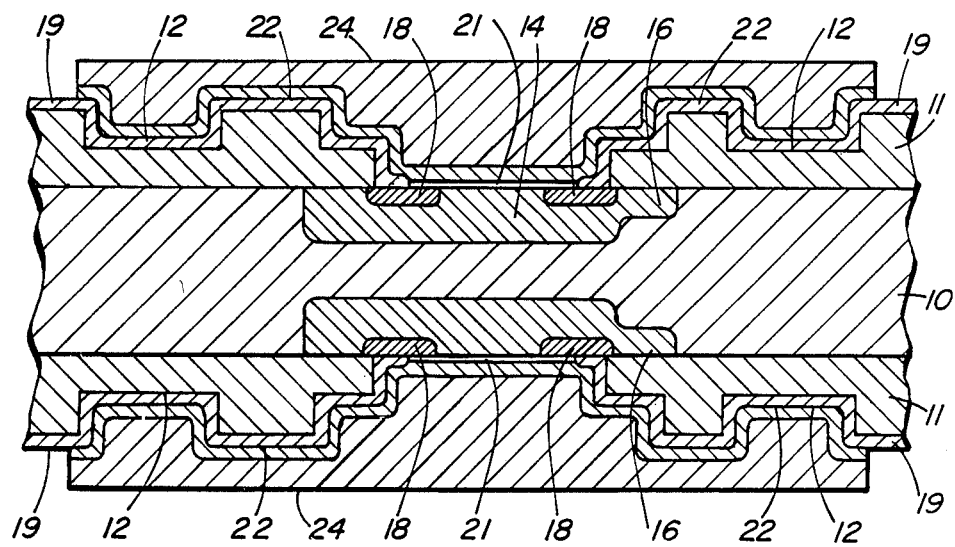
FIG. 2 marked PRIOR ART is a sectional view of another known type of bi-directional protector device.
Figure 3:
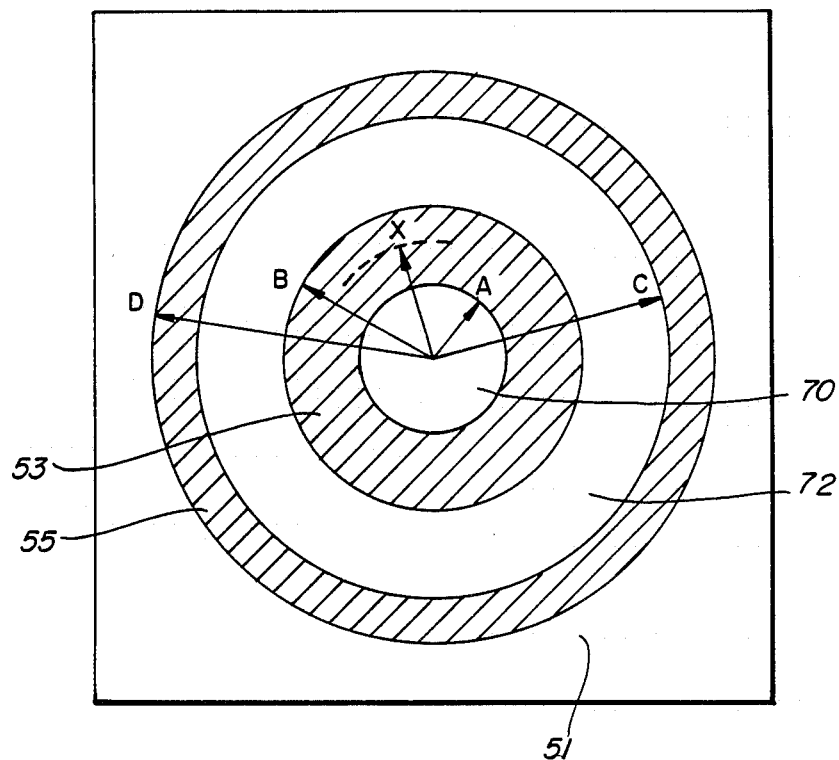
FIG. 3 is a plan view of a circular solid state bi-directional device according to the invention.
Figure 4:
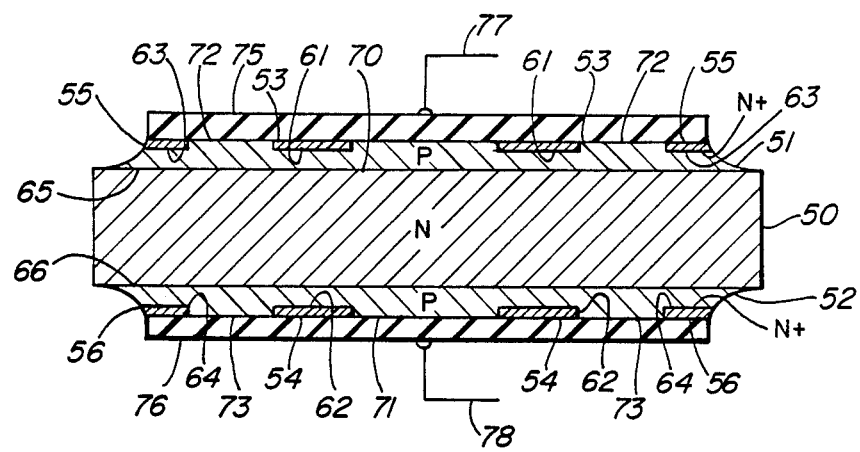
FIG. 4 is a cross-sectional view taken across a diameter of the solid state bi-directional device illustrated in FIG. 3.
Figure 5:
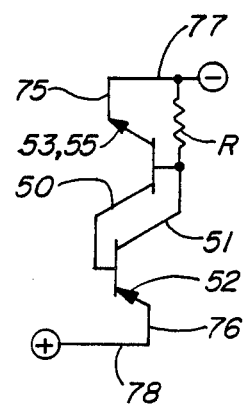
FIG. 5 is a simplified schematic representation of the solid state bi-directional device illustrated in FIG. 3 when operating in one polarity.

Referring in detail to FIGS. 3 and 4, there is shown a five-layer NPNPN semiconductor device. The device has an n-type central layer 50, p-type conductivity layers 51, 52 flanking the central layer, and n-type diffusions 53 to 56 formed within the p-type layers. The regions meet to form pn junctions 60 to 63. If the polarity of voltage applied across the device as is shown in FIG. 5, the junction 65, can be considered as the base-collector junction of two NPN transistors made up respectively of regions 50, 51, 53 and regions 50, 51, 55. The junctions 61, 63 can be considered as the base-emitter junctions of these notional transistor devices with the p-layer 51 functioning as base regions. With the same applied voltage, the junctions 66 can be considered as base-emitter junctions of a PNP transistor made up of regions 51, 50, 52. Because the device is symmetrical a reversal of this applied voltage will establish national transistors from the opposite side. Because the n-type regions 53, 54, 55, 56 are diffusions into the p-type layers 51, 52 the p-layers surround the n-type diffusions along their circumferential length. The p-layers have exposed surfaces 70 to 73 which are co-planar with the surfaces of the n-regions 53 to 56. The junctions 61 to 64 have a substantial portion extending generally parallel to these surfaces and to a lesser extent, extending generally perpendicular to and meeting the external surfaces of the device.

Conductive contacts 75 and 76 ar applied to opposed surfaces of the device. The contacts are connected to external terminals 77 and 78 and span base-emitter junctions 61 to 64. This results in shorting junctions at the intersections thereof.

In order to meet the operating criteria for the device, the following conditions must be met:
1. The total area of the n-type diffused regions must essentially equal that of the exposed p-type layers to ensure uniform current density and power dissipation.
2. The aspect ratio of the rings (L/W, the mean length/width), in which the inner diffused ring is shorted on both sides, and the outer diffused ring is shorted on only one side, must be such as to result in equal emitter shorting resistances. This results in the effective aspect ratio of the outer ring being essentially the same as that of the inner ring, thus:

$Ko = 2\pi/Ln(D/C)$ $Ki = 8\pi/Ln(B/A)$ where
Ko = the effective aspect ratio of the outer ring which is shorted on only one (i.e. inner) side.
Ki = the effective aspect ratio of the inner ring which is shorted on both sides.
To meet the operating criteria Ko = Ki.
3. The surface area from either side of each shorting junction to the radii of highest impedance must be equal to each other. To meet these criteria, the radii have the following relationship:

$D = 1.0$ $C = 0.842$ $B = 0.528$ $A = 0.264$ $X = 0.373$ $X^2 = (A \times B)$

As a result for a normalized maximum radius of 1: Ko = Ki = 36.25

As explained above and as indicated in the formulae, the effective aspect ratio differs by a factor of four depending upon whether the regions or rings are shorted on one side or both sides. In a rectangular configuration as described with reference to FIG. 6, the effective aspect ratio and the physical aspect ratio will have this 4:1 relationship. However, as can be seen from the above values, the relationship is altered somewhat in a circulo-symmetric implementation.

In the operation of the device, if a negative voltage is applied to top contact 75 relative to electrode 76, base-emitter junctions 61, 63 become forward biased and base-collector junction 65 becomes reverse-biased. At low current the base-emitter junctions 61, 63 are practically inoperative as transistor emitters because the surface regions 70 to 73 are shorted to the n-regions by the contact 75. A small saturation reverse current flows across base-collector junction 65.

As the voltage approaches the avalanche voltage of the junction 65, current flow within the p-layer 51 tends to bend parallel to the base-emitter junction. This current passes around both sides of the diffusions 53, 55 to the surface parts 70, 72. The current increases rapidly producing voltage drops in regions underneath 61, 63. This voltage drops forward bias the junctions 61, 63 with the largest bias occurring at the centre of junction 61 and at the peripheral edges of the junctions 63 furthest from shorting contact points (where the junctions meet the conductor 75).

The effective emitter efficiencies, and hence the gain of the NPN devices, increases rapidly with increased current flow. When the current reaches a level $I_s$ at which the sum of the low voltage gains of the NPN and PNP transistor sections of the device is greater than unity, the regions associated with n-diffusions 53, 55 all switch to a low voltage state. Ideally, the junctions 61, 63 switch at the same time. This is assured if the resistance of the current paths around the shorting contact junctions are equal. This is obtained by utilizing the design criteria discussed above.

The device is constructed utilizing standard semiconductor processing techniques. The NPNPN multilayer typically has a central n-type layer (200–250 microns thick) doped to a level of $7 \times 10^{14}$ carriers/cm$^3$, flanking p-type layers (less than 30 microns thick) doped to a level of $10^{17}$ to $10^{18}$ carriers/cm$^3$ and n-type diffusion regions (greater than 0.5 microns thick) doped to a level of $10^{20}$ to $10^{21}$ carriers/cm$^3$. The control n-type layers and the adjacent p-type layers were doped to produce a breakdown voltage of about 300 volts which is a typical value for telephone applications.

The significant NPNP switching section of the device depends on the voltage polarity. Thus, when the terminals 77 are more negative than the terminal 78, the switching region is the NPNP multilayer comprising regions and layers 53, 55, 51, 50, 52. The lower diffusions 54, 56 are of no significance once the device switches to its low impedance state since the associated pn junctions are reverse biased and current simply skirts around the diffusions entering the protection device. Current enters through the area 71, 73 and, at low voltage, travels vertically upwards to the p-regions 70, 72 exposed to the top contacts. When the device switches, the current is drawn around the diffusions 54, 56 and travels to the junctions 61, 63.

Figure 6:
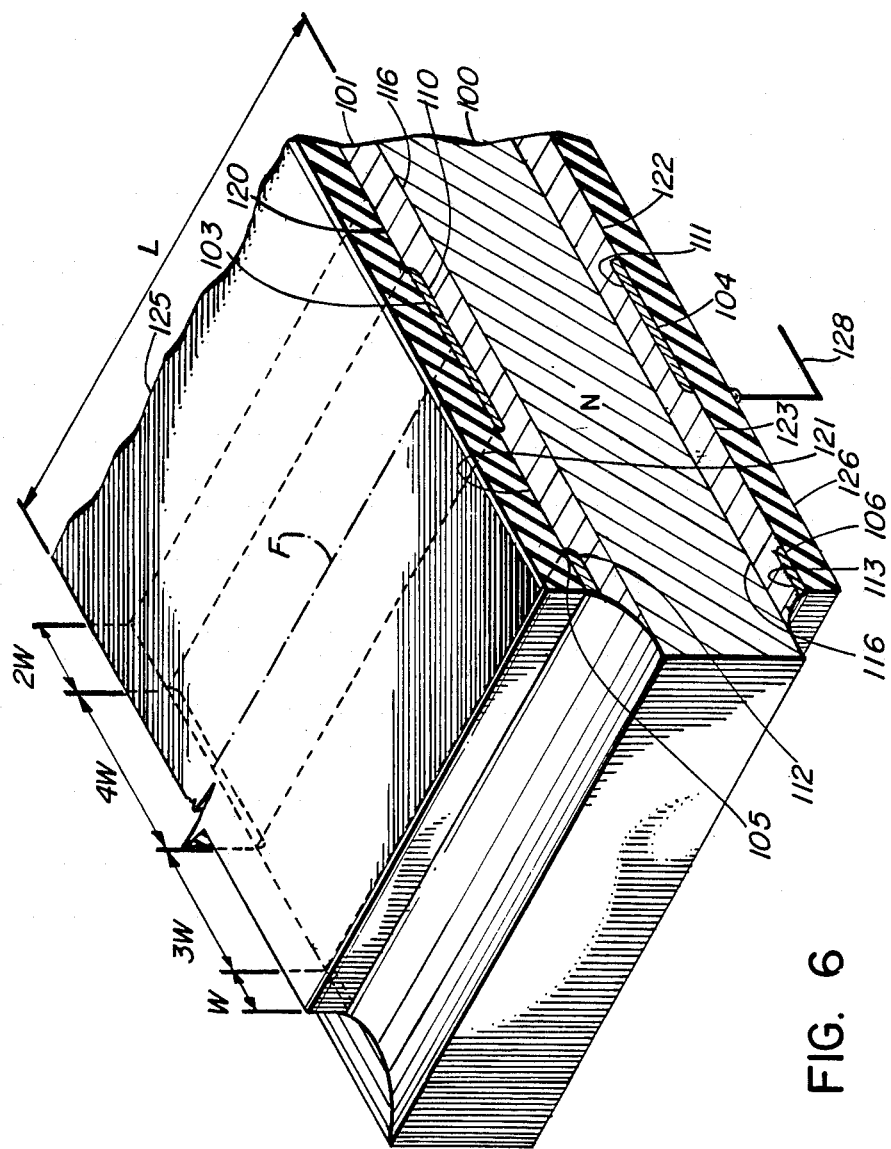
FIG. 6 is an isometric view of a portion of a rectangular solid state bi-directional device according to the invention.

Referring in detail to FIG. 6, there is shown a portion of a five-layer NPNPN rectangular semiconductor device. The device has an n-type central layer 100, p-type conductivity layers 101, 102 flanking the central layer, and n-type diffusions 103 to 106 formed within the p-type layers. The regions meet to form pn junctions 110 to 113. Depending on the polarity of the applied voltage as in the circular device of FIG. 3, there is formed two NPN transistors having base-emitter junctions 110 and 112 and a PNP transistor having a base-collector junction 116. Because this device is also symmetrical, a reversal of the applied voltage will establish a transistor-like structure from the opposite side with base-emitting junctions 111 and 113 and base-collector junction 115 forming the NPN and PNP transistors respectively. The p-type layers have exposed surfaces 120 to 123 which are coplanar with the surfaces of the n-type regions 103 to 106.

Conductive contacts 125 and 126 are applied to opposed surfaces of the device. The contacts are connected to external terminals 127 and 128 and spanned and short-circuit base-emitter junctions 110 to 113.

The device has at least one pair of opposed n-type diffused regions 103 and 104 which are bounded by the p-type region so as to form shorted contacts at the junction of the conductive layer 125, 126 along both their longitudinal sides. Shorting both sides substantially quarters the shorting resistance of a region of similar dimensions which is shorted by the contact 125 along only one longitudinal side.

As stated above, only a portion of the device is illustrated in the drawing. It could readily be extended to have several more diffused regions similar to regions 103, 104 which are shorted on both sides, as well as a pair of additional regions at the other end of the device which are similar to regions 105, 106 that are shorted on only one side. Alternatively, the end regions 105, 106 could be eliminated altogether and the width of the exposed layer 120 adjusted to balance that of the region 103.

To maintain the same shorting resistance when the device is conducting in an overvoltage mode, the diffused regions 103 to 106 and the exposed surfaces 120 to 123 have widths of W and 4 W as illustrated in FIG. 6. To maintain a balanced current density, the exposed p-type regions have widths of 3 W and 2 W, also as shown. As a result each diffused region 103 to 106 has an adjacent p-type exposed region of equal area from the shorting junction to a line of highest impedance. This line is at the exterior edge in regions 105, 106 and along the center line F of regions 103, 104. As in the circular device, the structural aspect ratio L/W of each of the n-diffused regions is greater than about 36:1 for a region shorted on one side and 9:1 for a region shorted on both sides. This provides an effective aspect ratio of greater than about 36:1 for the parameters which determine the resistance R and ensures that the effective resistance path of the p-layer when the NPN device is active is such as to have a minimum holding current to 260 milliamps. Normally, there is no connection between the various diffused regions 103, 105 and 104, 106 on the same side of the device. However providing such a connection may result in more uniform switching conditions. Hence this alternative structure can be utilized as long as there is no decrease in the effective aspect ratio of the device.

For optimum performance, the current input density at one side of the device should be equal to the current output density at the other side of the device. This can be ensured if the total area of n-type diffusion exposed to the contacts at one surface is equal to the total area of p-type region exposed to the contacts at the opposed surface.

Thus, for a high holding current it is advantageous if the n-type and p-type areas of a conventional NPNPN device are subdivided into a series of stripes. The stripes may be linear as shown in FIG. 6 or concentric as shown in FIG. 3.

What is claimed is:

1. A five-layer structurally symmetrical bi-directional overvoltage protection device comprising:
a central semiconductor layer of one semiconductor type;
flanking semiconductor layers of an opposite semiconductor type;
at least one region of said one semiconductor type in each of the flanking layers at each outer face thereof, each region being disposed directly opposite a region in the other flanking layer;
each of the outer faces having an electrode in conductive contact thereon which extends to cover the regions and exposed parts of the layers contiguous thereto;

the area of the flanking layers exposed to the contacts at each surface being substantially equal to the area of the regions exposed thereto whereby when the device is conducting current in the on state, the current input density at one surface is substantially equal to the current output density at the opposed surface; and characterized by a shorting junction formed at the intersection of the outer face of each layer, the electrode in conductive contact therewith and the contiguous region;

the shorting junction extending along both sides of at least one of the regions in each of the flanking layers, so that for a given width the effective shorting resistance resulting from the shorting junction, of each of the flanking semiconductor layers when conducting is substantially one-fourth that of a region in which the electrode contacts the shorting junction along only one side.

2. A device as claimed in claim 1, wherein the one semiconductor type is an n-type and the opposite semiconductor type is a p-type.

3. A device as claimed in claim 2 in which each of the plurality of regions in each flanking layer has a length to width such that the resistance per unit length is substantially constant.

4. A device as claimed in claim 3 in which each of the flanking layers and the regions is rectangular and the length to width of each region is greater than about 30:1.

5. A device as claimed in claim 4 which comprises inner and outer circulo-symmetric regions, the inner region being shorted on both sides and the outer region being shorted on only its inner side.

* * * * *